US012607699B2

(12) United States Patent
Seo

(10) Patent No.: US 12,607,699 B2
(45) Date of Patent: Apr. 21, 2026

(54) MRI VIBRATION MEASURING DEVICE

(71) Applicant: KOREA RESEARCH INSTITUTE OF STANDARDS AND SCIENCE, Daejeon (KR)

(72) Inventor: Youngseob Seo, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 124 days.

(21) Appl. No.: 18/621,157

(22) Filed: Mar. 29, 2024

(65) Prior Publication Data

US 2024/0345196 A1      Oct. 17, 2024

(30) Foreign Application Priority Data

Apr. 11, 2023      (KR) ........................ 10-2023-0047268

(51) Int. Cl.
*G01R 33/58* (2006.01)
(52) U.S. Cl.
CPC .................................. *G01R 33/58* (2013.01)
(58) Field of Classification Search
CPC ........ G01R 33/58; G01M 7/025; G01M 7/06; G01H 9/00; G01P 15/18
See application file for complete search history.

(56) References Cited

U.S. PATENT DOCUMENTS

2015/0241540 A1* 8/2015 Vernickel ......... G01R 33/56375
324/309

FOREIGN PATENT DOCUMENTS

| | | |
|---|---|---|
| CN | 105352690 A | 2/2016 |
| KR | 10-2015-0033693 A | 4/2015 |
| KR | 10-2018-0091226 A | 8/2018 |
| KR | 10-2021-0078843 A | 6/2021 |
| KR | 10-2021-0082176 A | 7/2021 |

OTHER PUBLICATIONS

Korean Office Action for related KR Application No. 10-2023-0047268 mailed Apr. 8, 2025 from Korean Intellectual Property Office.

* cited by examiner

*Primary Examiner* — G.M. A Hyder
(74) *Attorney, Agent, or Firm* — Paratus Law Group, PLLC

(57)                    ABSTRACT

The present embodiment relates to a magnetic resonance imaging (MRI) vibration measurement device for measuring vibrations of an object inserted into an MRI scanner, and the MRI vibration measurement device includes a human phantom apparatus including a human phantom inserted into the MRI scanner in z-axis direction (head-to-foot direction), a light source which emits light, a mirror structure which emits the light to the human phantom and provides light reflected by the human phantom, an optical sensor which measures the reflected light to detect the z-axis direction vibrations of the human phantom, and a vibration sensor part which is disposed in the human phantom apparatus and detects vibrations in both x-axis and y-axis directions which are perpendicular to each other and are orthogonal to the z-axis.

9 Claims, 5 Drawing Sheets

FIG. 4 x-DIRECTION VIBRATION ACCELERATION y-DIRECTION VIBRATION ACCELERATION z-DIRECTION VIBRATION ACCELERATION time(s)

MRI VIBRATION MEASURING DEVICE

This application claims priority to and the benefit of Korean Patent Application No. 10-2023-0047268, filed on Apr. 11, 2023, the disclosure of which is incorporated herein by reference in its entirety.

BACKGROUND

1. Field of the Disclosure

The present disclosure relates to a magnetic resonance imaging (MRI) vibration measurement device.

2. Discussion of Related Art

Since the temporal resolution of magnetic resonance imaging (MRI) images is low, MRI images are sensitive to movement, image distortion and image artifacts due to movement of a patient or mechanical vibrations of an MRI system are present in the MRI images, and thus re-scanning or duplicate scannings are frequently required.

Particularly, the human brain is a soft and complex biomaterial, and because of various physiological dynamics, the human brain is regularly moved and deformed. Therefore, while the heart contracts and relaxes during a heartbeat cycle, a periodic change in arterial blood pressure is transmitted through blood vessels to cause local movement and deformation of the brain.

In addition, a diffusion tensor imaging technique used in brain disease research is sensitive to even minute movement in a brain image region during MRI scans, and is affected not only by patient movement but also by mechanical vibrations of an MRI scanner. Accordingly, inaccurate quantitative indicators (fractional anisotropy (FA), radial diffusivity (RD), axial diffusivity (AD), and mean diffusivity (MD)) of diffusion tensor metrics are extracted due to image distortion and a decrease in signal-to-noise ratio, and thus an accurate diagnosis of a brain disease is not performed.

For such reasons, there is a problem that image quality obtained by an MRI device is degraded, and re-scanning is required.

SUMMARY OF THE INVENTION

Conventionally, in a process of performing an MRI device and acquiring an image, vibrations have not been detected, and the magnitude and direction of the vibrations have not been detected. Accordingly, there is a difficulty in obtaining quantitative data required to reduce or remove the vibrations.

The removal of the difficulty of the conventional technology is one problem to be solved by the present disclosure. That is, the present disclosure is directed to providing a device capable of measuring vibrations which occur in a process of driving an MRI device.

According to an aspect of the present disclosure, there is provided a magnetic resonance imaging (MRI) vibration measurement device for measuring vibrations of an object inserted into the bore of an MRI scanner. The MRI vibration measurement device including a human phantom inserted into the MRI scanner in a direction (z-axis (head-to-foot direction); a light source which emits light; a mirror structure which emits the light to the human phantom and provides light reflected by the human phantom; a fiber-optic sensor which measures the reflected light to detect z-axis direction vibration of the human phantom, and a vibration sensor part, which is disposed in the human phantom holding apparatus, detects vibrations in x-axis and y-axis directions. The x-, y- and z-axis directions are orthogonal.

The human phantom may have any one shape of a spherical shape and a cylindrical shape, and the human phantom may be formed of any one material of glass and high density polyethylene (HDPE).

The human phantom holding apparatus may further include a phantom fixing member for firmly holding the human phantom, and the phantom fixing member may be formed of a polyethylene plastic material which is a non-magnetic material and externally expose at least a portion of the human phantom.

The vibration sensor part may be formed of a non-magnetic material and include at least one vibration sensor for measuring vibrations in two directions (an x-axis and a y-axis) which are perpendicular to each other and form 90 degrees with respect to the direction (z-axis) in which the human phantom is inserted into the MRI scanner and a vibration sensor for measuring vibrations on the z-axis.

The MRI vibration measurement device may include a light source which emits light, a mirror structure which emits the light to the human phantom and provides light reflected by the human phantom, and a sensor which measures the reflected light to detect the z-axis direction vibration of the human phantom.

The mirror structure may include a support shaft inserted into the MRI scanner along the z-axis (head-to-foot direction), a mirror which is positioned on an end portion of the support shaft, and reflects the light to the human phantom, a counter weight positioned on an end portion of the support shaft opposite to the mirror, and a holding leg part which fixes the mirror structure to a bottom.

According to another aspect of the present disclosure, there is provided a magnetic resonance imaging (MRI) vibration measurement device for measuring vibrations of an object inserted into the bore of an MRI scanner, the MRI vibration measurement device with a human phantom holding apparatus including a human phantom inserted into the MRI scanner, and a vibration sensor part disposed in the human phantom holding apparatus and formed of a non-magnetic material, wherein the vibration sensor part includes at least two accelerometer sensors for measuring vibrations in x-axis and y-axis directions which are perpendicular to each other and also are orthogonal to the z-axis direction in which the human phantom is inserted into the MRI scanner.

The human phantom may have any one shape of a spherical shape and a cylindrical shape, and the human phantom may be formed of any one material of glass and high density polyethylene (HDPE).

The human phantom apparatus may further include a phantom fixing apparatus for firmly holding the human phantom, and the phantom fixing member may be formed of a polyethylene plastic material which is a non-magnetic material and externally expose at least a portion of the human phantom.

The vibration sensor part may further include an accelerometer sensor which is formed of a non-magnetic material and measures vibrations on the z-axis (head-to-foot direction).

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 4 is a schematic diagram illustrating an MRI vibration measurement device according to a second embodiment.

DETAILED DESCRIPTION OF EXEMPLARY EMBODIMENTS

Figure 1A:
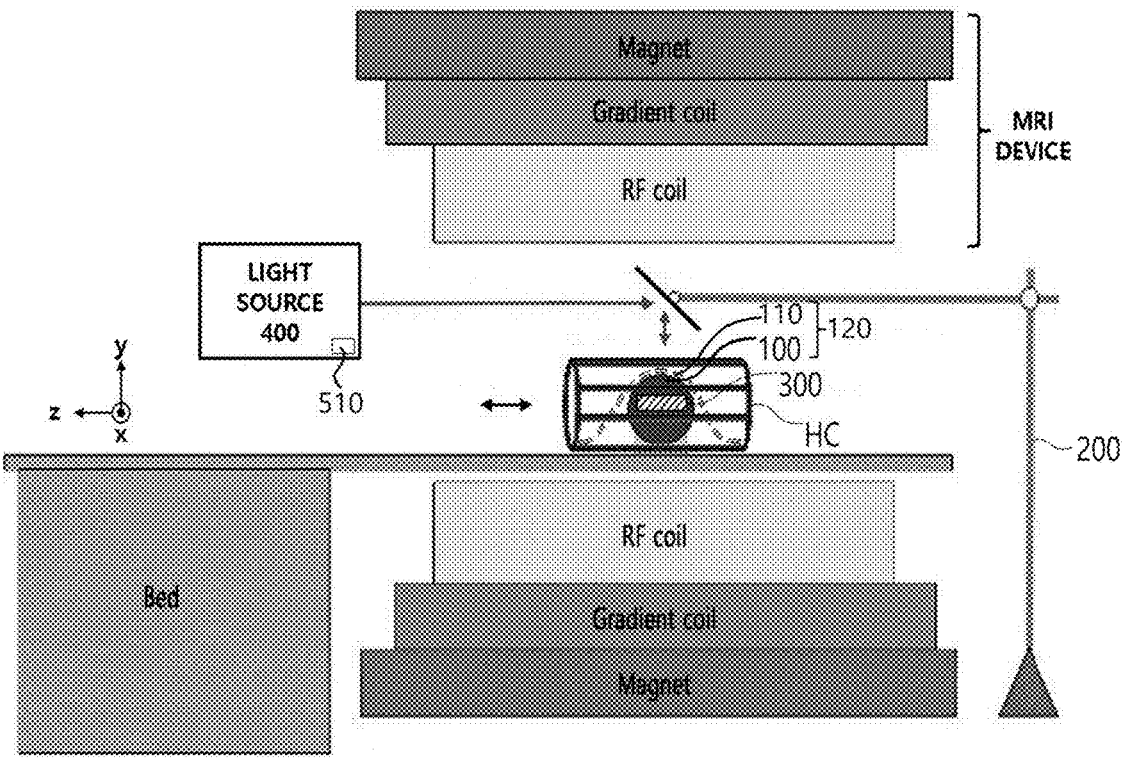
FIG. 1A and FIG. 1B are schematic diagrams illustrating a magnetic resonance imaging (MRI) vibration measurement device according to a first embodiment.
Figure 1B:
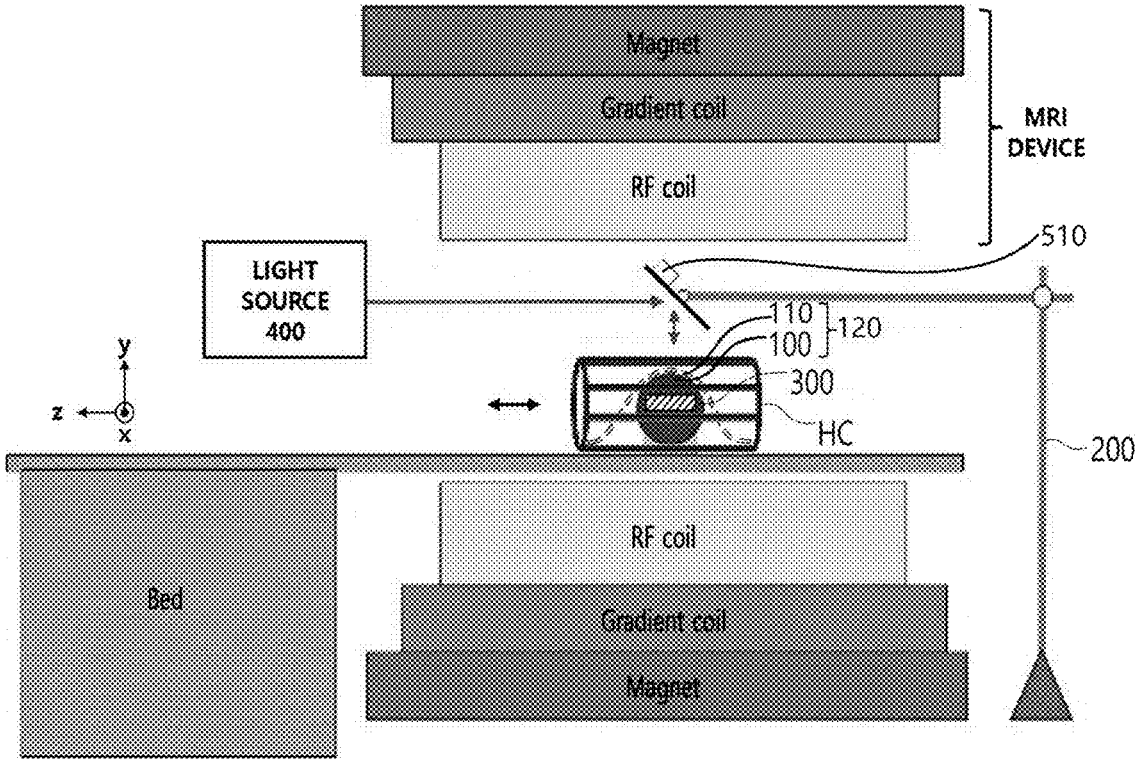

Hereinafter, present embodiments will be described with reference to the accompanying drawings. FIG. 1A and FIG. 1B are schematic diagrams illustrating a magnetic resonance imaging (MRI) vibration measurement device according to a first embodiment. Referring to FIGS. 1A and 1B, the MRI vibration measurement device according to the present embodiment includes a human phantom apparatus 120 including a human phantom 100 inserted into the bore of an MRI scanner in a direction (z-axis, head-to-foot direction), a light source 400 which emits light, a mirror structure 200 which emits light to the human phantom 100 and provides light reflected by the human phantom 100, an optical sensor 510 which measures reflected light and detects z-axis direction vibrations of the human phantom, and a vibration sensor part 300 which is disposed in the human phantom 100 and detects vibrations in x-axis and y-axis directions which are perpendicular to each other, and the x- and y-axis directions are orthogonal to the z-axis.

An MRI technology is a medical imaging technology used for acquiring an image of an anatomical structure and a physiological process of a human body positioned in an MRI scanner. The MRI system which generates an MRI image includes a magnet, a gradient coil, and a radio frequency (RF) coil and noninvasively generates an image of the inside of an object using a magnetic field, a dynamic magnetic field, and an RF energy. However, MR images of an object are degraded due to mechanical vibrations of the MRI device frequently.

In the first embodiment of the MRI vibration measurement device, the human phantom apparatus 120 including the human phantom 100 is fixedly positioned on a bed. As one embodiment, the human phantom apparatus 120 may include the human phantom 100 and a phantom fixing member 110 which firmly holds the human phantom 100 to the bed. As illustrated in the drawing, the human phantom apparatus 120 may be positioned in a head coil HC for generating a high resolution MR image of the human head.

Figure 2A:
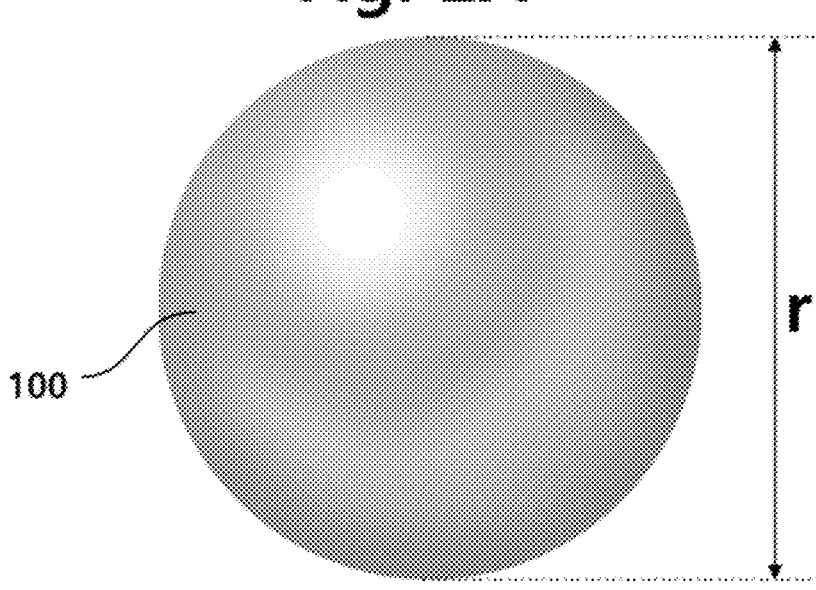
FIG. 2A is a diagram illustrating an example of a spherical human phantom.
Figure 2B:
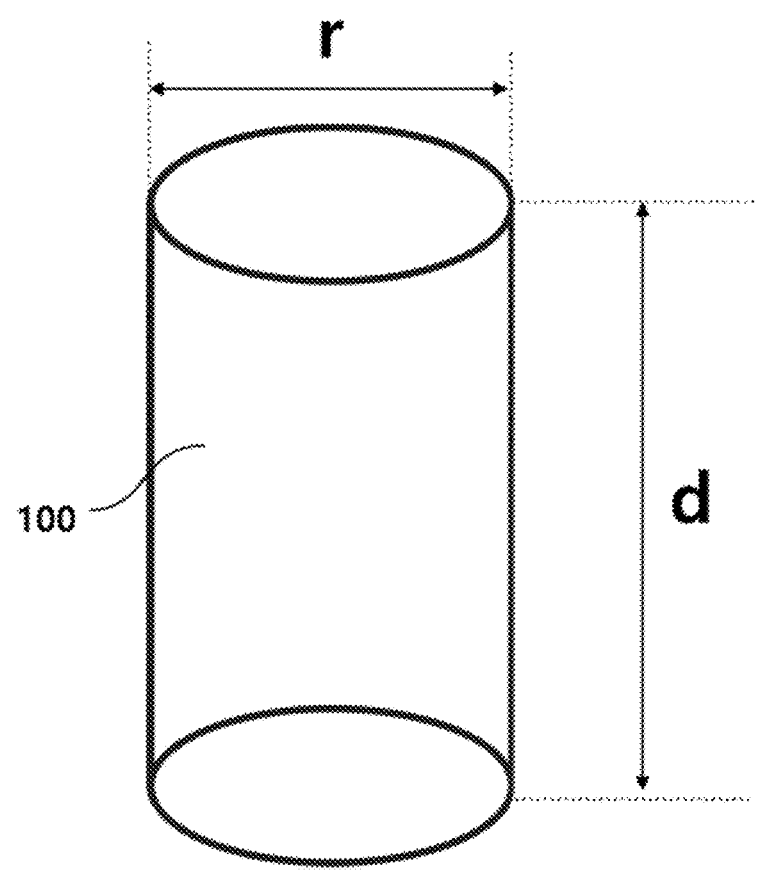
FIG. 2B is a diagram illustrating an example of a cylindrical human phantom.

The human phantom 100 is designed based on a Korean standard human head shape. As one embodiment, as illustrated in FIG. 2A, the human phantom 100 has a spherical shape with a diameter of 160 mm. As another embodiment, as illustrated in FIG. 2B, the human phantom 100 has a cylindrical shape with a diameter of 100 mm and a length of 167 cm. The human phantom may be formed of any one material of glass and high-density polyethylene plastic.

An inner portion of the spherical human phantom is filled with 2000 mL of a nickel chloride hydrate solution, and an inner portion of the cylindrical human phantom is filled with 1180 mL of the nickel chloride hydrate solution.

The phantom fixing member 110 firmly holds the human phantom 100 to the bed. As one embodiment, the phantom fixing member 110 firmly holds the human phantom 100 so that a portion of the human phantom 100 is exposed, and light reflected by a mirror 210 (see FIG. 3) is provided to the human phantom 100. As an example, the phantom fixing member 110 may be formed of rubber in a net shape and fix the human phantom to the bed. As another example, the phantom fixing member 110 may be formed to expose at least a partial surface of the human phantom.

The phantom fixing member 110 is formed of a nonmagnetic material. As described above, the human phantom 100 is positioned in the MRI scanner. Accordingly, when the phantom fixing member 110 includes a magnetic material, the phantom fixing member may be moved into the MRI scanner by a strong magnetic field force. Thus, it may damage the MRI scanner. In order to prevent this damage, the phantom fixing member 110 is formed of the nonmagnetic material.

Figure 3:
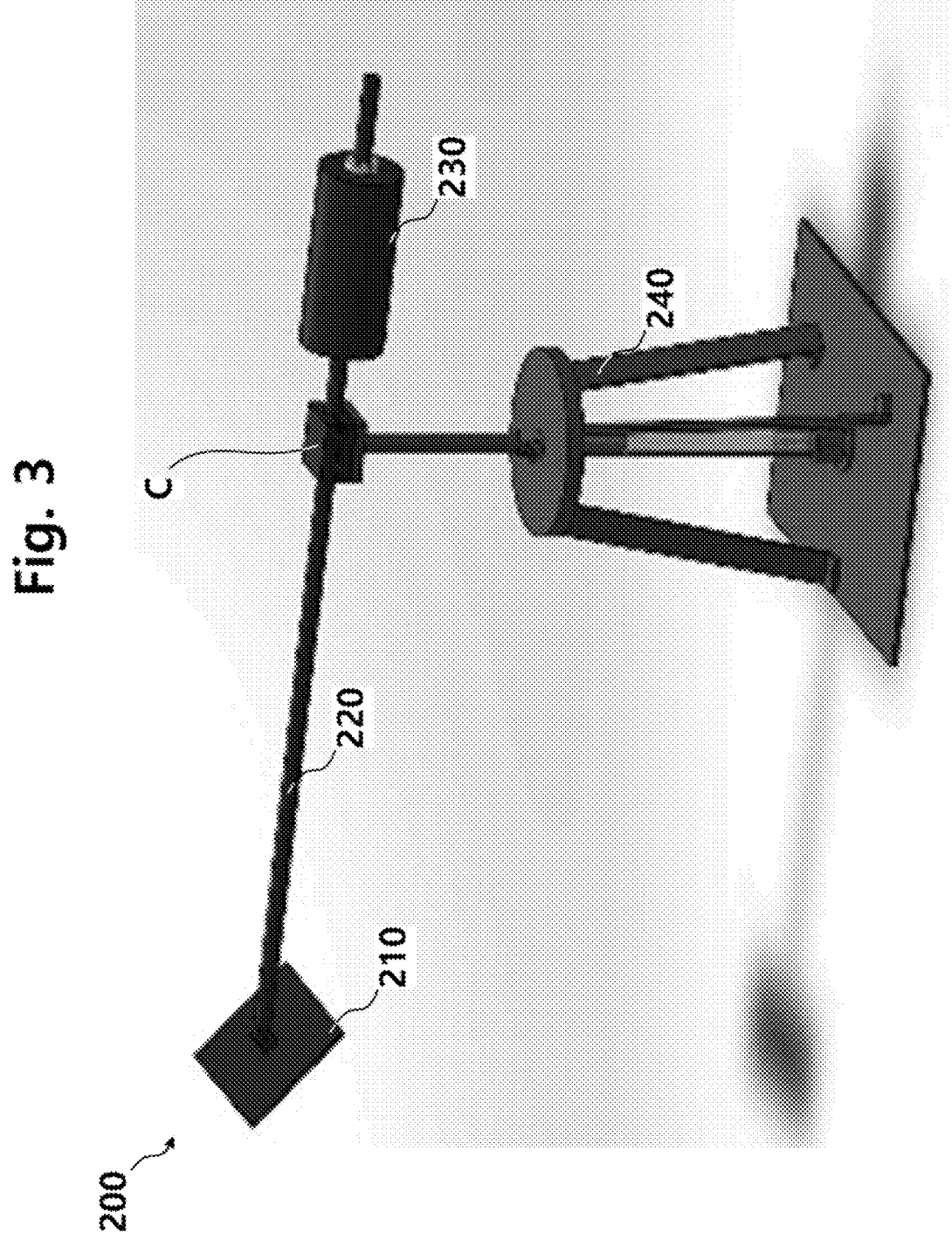
FIG. 3 is a schematic diagram illustrating a mirror structure which reflects the light provided by a light source to a human phantom.

FIG. 3 is a schematic diagram illustrating the mirror structure 200 which reflects light provided by the light source 400 and provides the light to the human phantom 100. Referring to FIGS. 1A, 1B, and 3, the light source 400 provides light into the MRI scanner. As one embodiment, the light provided by the light source 400 is a straight laser ray, and the light source 400 may be a laser ray source.

In one embodiment, the mirror structure 200 includes a support shaft 220 inserted into the bore of the MRI scanner along the z-axis, the mirror 210 which is positioned on an end portion of the support shaft 220 and reflects the light provided by the light source to the human phantom, a counter weight 230 which is positioned on an opposite end portion of the support shaft 220, and a fixing leg part 240 which firmly supports the mirror structure 200 to a bottom.

The mirror 210 is positioned on one side end portion of the support shaft 220, and the counter weight 230 is positioned on the other side end portion thereof. A connecting part C may be positioned at an intermediate portion of the support shaft 220, and a connecting shaft connected to the support shaft 220 and the fixing leg part 240 may be connected to the connecting part C.

The connecting part C may move between one side end portion and the other side end portion along the support shaft 220 to adjust a position at which the mirror 210 is inserted into the MRI scanner. The counter weight 230 formed on the opposite end portion of the support shaft 220 may also be moved between one side end portion and the other side end portion of the support shaft 220 to balance a weight. The connecting shaft fastened to the fixing leg part 240 is connected to the connecting part C. Accordingly, the mirror structure 200 may be firmly held to the fixing leg part 240 without shaking.

As described above, since the mirror structure 200 is used in the MRI scanner in which a strong magnetic field is formed, when a magnetic material is included, the mirror structure 200 is moved by the strong magnetic field force and has a risk of damaging the MRI system. Accordingly, at least the mirror 210 and the support shaft 220 of the mirror structure 200 are formed of non-magnetic materials. Preferably, the mirror 210, the support shaft 220, the counter weight 230, the connecting part C, and the fixing leg part 240 of the mirror structure 200 may be formed of non-magnetic materials.

A sensor 300 capable of measuring x-direction and y-direction vibrations may be disposed in the human phantom 100 inserted into the MRI scanner. As an example, the sensor 300 may be an optic-fiber accelerometer sensor, and as illustrated in the drawings, the single sensor 300 may detect both x-direction and y-direction accelerations. In an embodiment which is not illustrated, a sensor may be provided as a plurality of sensors including a sensor which measures both an x-direction acceleration and a sensor which measures a y-direction acceleration simultaneously.

The mirror 210 reflects light provided by the light source 400 and provides the reflected light to the human phantom 100. The light provided to an exposed surface of the human phantom 100 may be reflected by the human phantom 100 and provided to the mirror again. Vibrations of the MRI system during MRI scanning cause the movement of the human phantom 100, and thus the light reflected by the human phantom 100 is also vibrated.

As an embodiment described in FIG. 1A, the mirror 210 also provides the light reflected by the human phantom 100 to an optical sensor 510 positioned outside the MRI scanner. The optical sensor 510 may detect the light reflected by the human phantom 100 while the human phantom 100 vibrates, and measures z-axis direction vibrations of the human phantom 100.

As another embodiment described in FIG. 1B, light reflected by the human phantom 100 while the human phantom vibrates may be provided to an optical sensor 510 positioned in the mirror structure 200. The optical sensor 510 positioned in the mirror structure 200 may detect the light reflected by the human phantom 100 while the human phantom 100 vibrates in order to detect z-axis direction vibrations of the human phantom 100.

Figure 4:
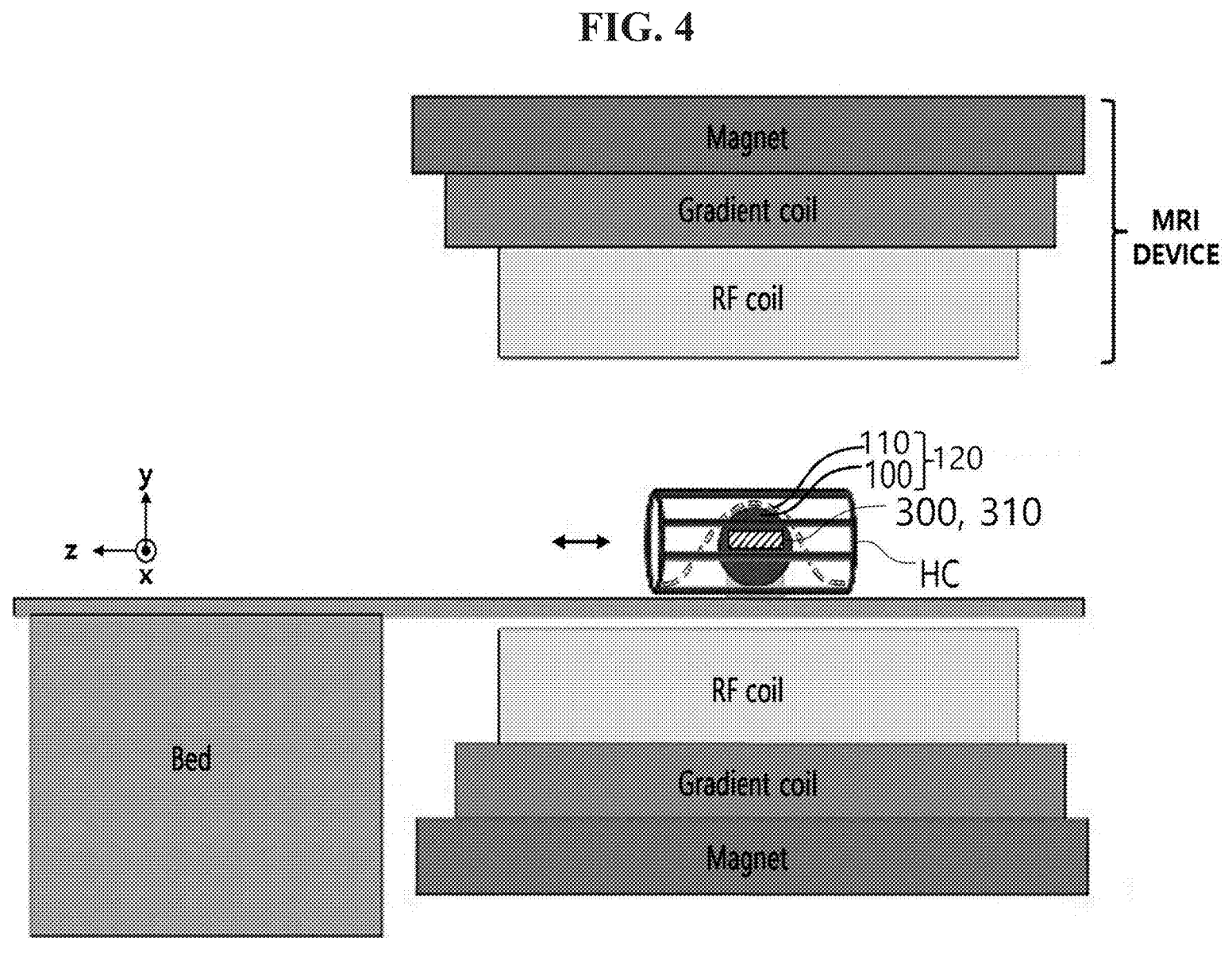

Hereinafter, an MRI vibration measurement device according to a second embodiment will be described. However, the same or similar components to those of the above-described embodiment may be omitted for the sake of simple and clear description. FIG. 4 is a schematic diagram illustrating the MRI vibration measurement device according to the second embodiment. Referring to FIG. 4, the MRI vibration measurement device according to another embodiment includes a human phantom apparatus 120 including a human phantom 100 inserted into an MRI scanner and a vibration sensor part 300 disposed in the human phantom apparatus 120 and formed of a non-magnetic material, and the vibration sensor part 300 includes at least one or more accelerometer sensors which detect vibrations in x-axis and y-axis directions which are perpendicular to each other and also are orthogonal z-axis direction in which the human phantom is inserted into the MRI scanner.

The human phantom 100 is positioned in the phantom fixing member 110 and fixed to a bed. The sensors 300 which measure vibrations of the human phantom 100 may be attached to the human phantom apparatus 120. As one embodiment, the sensors 300 may measure an acceleration in the x-direction and an acceleration in the y-direction, and an accelerometer sensor 310 which measures an acceleration in the z-direction. Among them, sensors which measure accelerations in any two directions may be implemented as one sensor.

The sensors 300, 310 may be made of injection control pressure (ICP) shear accelerometer sensors in which interference and noise due to a strong magnetic field of 1.5 teslas or more and also electromagnetic waves which are formed in the MRI scanner. The sensors have a length of 10 mm, sensitivities of 102.7 and 101.1 mV/g, and output biases of 10.8 and 10.9 VDC.

As described above, the sensor 300 which measures vibrations of the human phantom 100 is positioned and operated in an MRI scanner in which a strong magnetic field is formed. Since the sensor may be moved by the magnetic field and damage the MRI device in the case of the sensor 300 including a magnetic material, the sensor 300 may be formed of a non-magnetic material to prevent damage to the MRI device and the sensor.

Implementation Example

A cylindrical phantom (a diameter of 100 mm and a length of 230 mm) was designed and constructed, based on a shape of a Korean standard human head and neck. device mirror fixing stand capable of firmly holding the phantom was designed and formed using a non-magnetic plastic. In addition, a phantom holding apparatus formed of an insulating plastic net which is a non-magnetic material was formed to tightly fix the phantom to a bed.

X-axis and y-axis direction vibrations were measured using a first vibration measurement sensor capable of detecting x-axis and y-axis vibrations, and z-axis direction vibrations were measured using a second vibration measurement sensor capable of detecting z-axis vibrations simultaneously.

Figure 5:
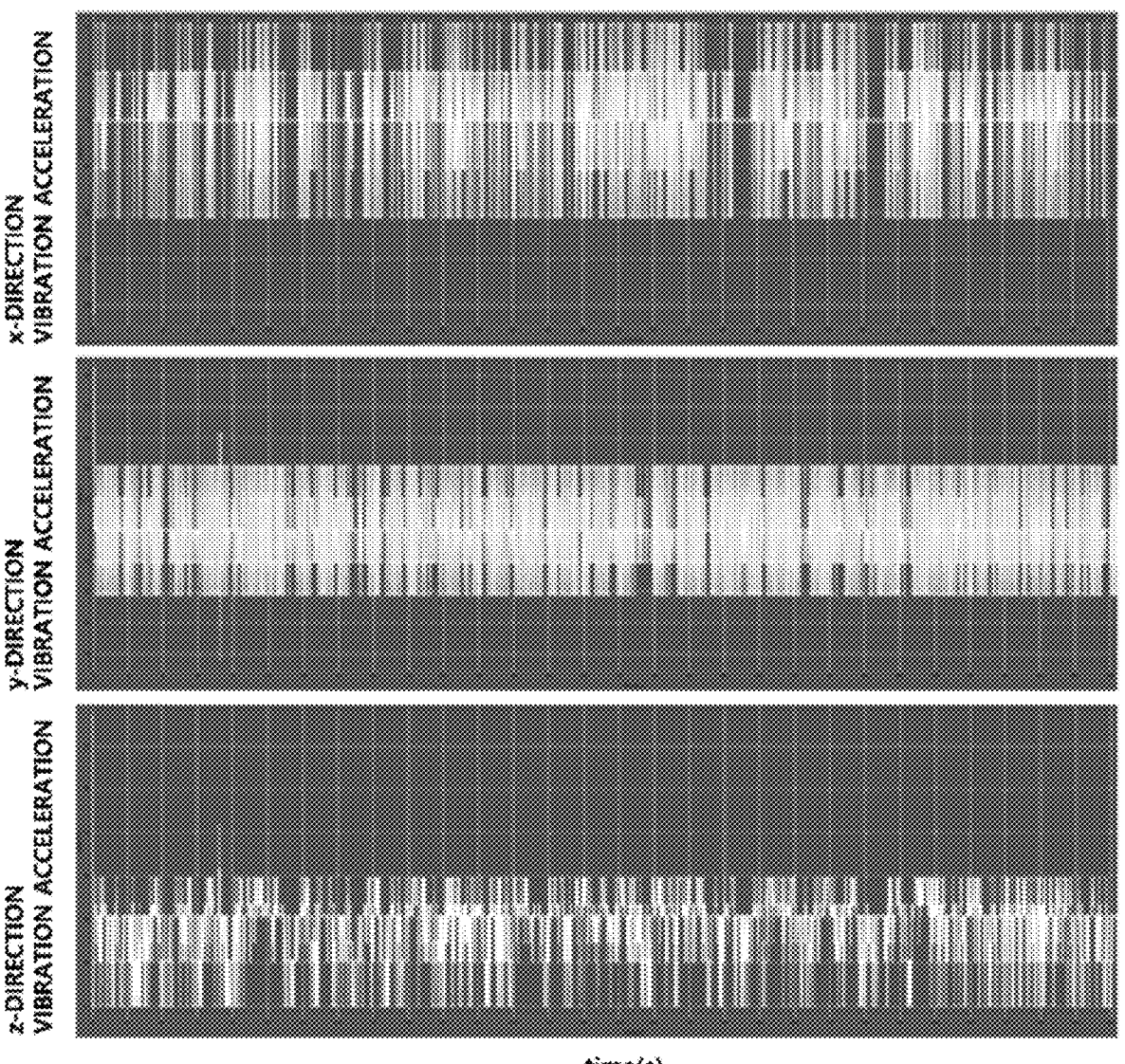
FIG. 5 is a diagram illustrating x-axis, y-axis, and z-axis accelerations measured by an MRI vibration measurement device.

FIG. 5 is a diagram illustrating x-axis, y-axis, and z-axis accelerations measured in the above-described environment. As shown in FIG. 5, it can be seen that, when the MRI scanner is performed, x-axis, y-axis, and z-axis vibrations occur, and the MRI vibration measurement device can detect and quantify the vibrations through the present embodiments.

According to the present disclosure, there is an advantage of measuring and quantifying vibrations occurring when an MRI device is operated.

Although the present disclosure has been described to facilitate understanding of the present disclosure with reference to embodiments illustrated in the accompanying drawings, the embodiments are only exemplary, and it will be understood by those skilled in the art that various modifications and equivalent other example embodiments may be made from the embodiments of the present disclosure. Therefore, the scope of the present disclosure should be defined by the appended claims.

What is claimed is:

1. A magnetic resonance imaging (MRI) vibration measurement device for measuring vibrations of an object inserted into an MRI scanner, the MRI vibration measurement device comprising:

a human phantom apparatus including a human phantom inserted into the MRI scanner in a direction (z-axis, head-to-foot direction);

a light source which emits light;

a mirror structure which emits the light to the human phantom and provides light reflected by the human phantom;

an optical sensor which measures the reflected light to detect z-axis direction vibrations of the human phantom; and a vibration sensor part which is disposed in the human phantom apparatus and detects vibrations in both x-axis and y-axis directions which are perpendicular to each other and orthogonal to the z-axis, wherein the human phantom is an object configured to mimic human characteristics.

2. The MRI vibration measurement device of claim 1, wherein:

the human phantom has any one shape of a spherical shape and a cylindrical shape; and the human phantom is formed of any one material of glass and high density polyethylene (HDPE).

3. The MRI vibration measurement device of claim 1, wherein:

the human phantom apparatus further includes a phantom fixing member for firmly holding the human phantom; and the phantom fixing member is formed of a polyethylene plastic material which is a non-magnetic material and externally exposes at least a portion of the human phantom.

4. The MRI vibration measurement device of claim 1, wherein the vibration sensor part is formed of a non-magnetic material and includes at least one vibration sensor for measuring vibrations in two directions (an x-axis and a y-axis) which are perpendicular to each other and are orthogonal to the direction (z-axis) in which the human phantom is inserted into the MRI scanner and a vibration sensor for measuring vibrations on the z-axis.

5. The MRI vibration measurement device of claim 4, wherein the MRI vibration measurement device includes:

a light source which emits light;

a mirror structure which emits the light to the human phantom and provides light reflected by the human phantom; and a sensor which measures the reflected light to detect z-axis direction vibrations of the human phantom.

6. The MRI vibration measurement device of claim 4, wherein the mirror structure includes:

a support shaft inserted into the MRI scanner along the z-axis;

a mirror which is positioned on an end portion of the support shaft and reflects and provides the light to the human phantom;

8 a counter weight positioned on an opposite end portion of the support shaft; and a fixing leg part which firmly holds the mirror structure to a bottom.

7. A magnetic resonance imaging (MRI) vibration measurement device for measuring vibrations of an object inserted into an MRI scanner, the MRI vibration measurement device comprising:

a human phantom apparatus including a human phantom inserted into the MRI scanner; and a vibration sensor part disposed in the human phantom apparatus and formed of a non-magnetic material, wherein the vibration sensor part includes at least one accelerometer sensor for measuring vibrations in x-axis and y-axis directions which are perpendicular to each other and also are orthogonal to a direction (z-axis) in which the human phantom is inserted into the MRI scanner, wherein the human phantom has any one shape of a spherical shape and a cylindrical shape, and wherein the human phantom is formed of any one material of glass and high density polyethylene (HDPE).

8. The MRI vibration measurement device of claim 7, wherein:

the human phantom apparatus further includes a phantom fixing member for fixing the human phantom to a bed; and the phantom fixing member is formed of a polyethylene plastic material which is a non-magnetic material and externally exposes at least a portion of the human phantom.

9. The MRI vibration measurement device of claim 7, wherein the vibration sensor part further includes a second accelerometer sensor which is formed of a non-magnetic material and measures vibrations on the z-axis.

* * * * *